United States Patent [19]

Namekawa et al.

[11] Patent Number: 5,467,913
[45] Date of Patent: Nov. 21, 1995

[54] SOLDER BALL SUPPLY DEVICE

[75] Inventors: Masatoshi Namekawa; Yoshiteru Ibuki; Norio Iguchi, all of Tanashi; Masatoshi Okuno, Nagano, all of Japan

[73] Assignees: Citizen Watch Co., Ltd., Tokyo; Miyota Co., Ltd., Nagano, both of Japan

[21] Appl. No.: 319,660

[22] PCT Filed: Mar. 2, 1994

[86] PCT No.: PCT/JP94/00337

§ 371 Date: Oct. 11, 1994

§ 102(e) Date: Oct. 11, 1994

[87] PCT Pub. No.: WO94/28580

PCT Pub. Date: Dec. 8, 1994

[30] Foreign Application Priority Data

May 31, 1993 [JP] Japan .................................. 5-154311

[51] Int. Cl.⁶ ............................. B23K 3/00; B23K 3/06
[52] U.S. Cl. ............................. 228/41; 228/246; 228/224; 221/211
[58] Field of Search .................... 228/180.1, 180.22, 228/244, 246, 254, 6.2, 41, 52, 224; 221/211

[56] References Cited

U.S. PATENT DOCUMENTS

| | | | |
|---|---|---|---|
| 4,558,812 | 12/1985 | Bailey et al. | 228/254 |
| 5,205,896 | 4/1993 | Brown et al. | 228/246 |
| 5,279,045 | 1/1994 | Odashima et al. | 228/246 |
| 5,284,287 | 2/1994 | Wilson et al. | 228/254 |

*Primary Examiner*—Samuel M. Heinrich
*Attorney, Agent, or Firm*—Kanesaka & Takeuchi

[57] ABSTRACT

A solder ball supply device comprising flux supply means 200 which supplies flux at the same time to input and output terminals on substrate 1 prior to supply of solder balls, and solder ball supply means 300 which takes out a number of solder balls from discharger 350 in which solder balls are held matrixwise at the same time in the same pattern as the pattern of said input and output terminals and supplies solder balls to said input and output terminals to which flux has been supplied.

16 Claims, 9 Drawing Sheets

SOLDER BALL SUPPLY DEVICE

BACKGROUND OF THE INVENTION

1. Field of the Invention

The present invention relates to a solder ball supply device which can supply a large number of preliminary solder balls, which are used for fixing tip parts of surface-mount-type to substrates, to the substrates at one time.

2. Background Technology

Along with advance in technologies in recent years, ICs are highly integrated than ever and there is a tendency of increase in the number of input and output terminals on the ICs. These input and output terminals are also miniaturized due to miniaturization of IC chips. Such input and output terminals are fixed on the four corners of IC packages or provided on the back of the packages.

In the case of IC chips having input and output terminals on the back of a package, a number of plated through-holes are provided on the back. Preliminary solder is supplied to the plated through-holes to fix the input and output terminals to the circuit board by the solder to ensure conductivity between them.

One method of supplying solder to plated through-holes on the back of packages is printing a creamy solder by screen printing. Another method comprises taking solder balls out of a storage section using a vacuum pick-up instrument, dipping these solder balls in a flux, and supplying them to the circuit board (U.S. Pat. No. 5,088,639).

The screen printing involves solder-drawing, a phenomenon in which a viscous creamy solder is drawn when screen is peeled off. Because some projections produced by the creamy solder are too small or too large, it is difficult to constantly supply a prescribed amount of solder cream. If the projections are too large, the amount of the solder cream is large and this solder cream may contact the other creamy solder in the narrowly pitched input and output terminals. This may cause short circuit between electrodes.

On the other hand, because the method proposed by U.S. Pat. No. 5,088,639 retains solder balls in a storage section, solder balls may not be sufficiently adsorbed by the vacuum pick-up instrument, if the number of balls to be picked-up are large when these are taken out from the storage section.

In addition, because in this method the solder balls are dipped in a flux as they are adsorbed in the vacuum pick-up instrument, the flux may be adhered to adsorption nozzles of the vacuum pick-up instrument. This may cause malfunction in adsorption of solder balls, and requires frequent cleaning of vacuum pick-up instrument.

An object of the present invention is therefore to provide a solder supply method without these problems, particularly, a solder supply method by which a large number of solder balls can be certainly supplied without causing adhesion of flux to the vacuum pick-up instrument.

DISCLOSURE OF THE INVENTION

The solder ball supply device of the present invention comprises a discharger in which solder ball holding cavities are provided matrixwise, a head section with a number of air suction holes provided at the same pitch as the solder ball holding cavities in the discharger, and a solder ball supply means which takes out a large number of solder balls at one time from solder ball holding cavities at the head section to transfer and supply them to the substrate boards. This construction ensures rapid supply of solder balls, significant improvement in the workability, and mass-production. In addition, the structure in which solder balls are stored matrixwise in the discharger makes it possible for the solder ball supply device of the present invention to be adaptable to a variety of patterns.

The solder ball supply device of the present invention may be further equipped with a flux dispenser in which nozzles are provided in the same pattern as the air suction holes in the head section of solder ball supply means, and which supplies flux onto the boards at one time prior to the supply of the solder balls. This construction can prevent the flux from being adhered to the solder ball head, thus preventing malfunction of the nozzles in the adsorption of solder balls.

Furthermore, the device of the present invention may be provided with deep recesses in the carrier which functions to move substrates. IC chips carried on the substrates are held in these recesses so that input and output terminals of the substrates can be positioned at a specified height irrespective of the thickness of the IC chips. Alternatively or in addition to this, the discharger may be provided with groups of solder ball holding cavities matrixwise, with each group having different pitches from others. This construction ensures the solder balls to be supplied to various types of substrates with IC chips having different thickness or input and output terminals with different pitches, making it possible for the device of the present invention to be adaptable to a small-scale production of various types of products.

Furthermore, the device of the present invention can be constructed such that a robot for supplying flux acts also as a robot for supplying solder balls, by selectively and alternately inserting the flux head or the solder ball head to the head of this robot. This ensures the overall device to be built compact, small, and inexpensive.

BEST MODE FOR CARRYING OUT THE INVENTION

Figure 1:
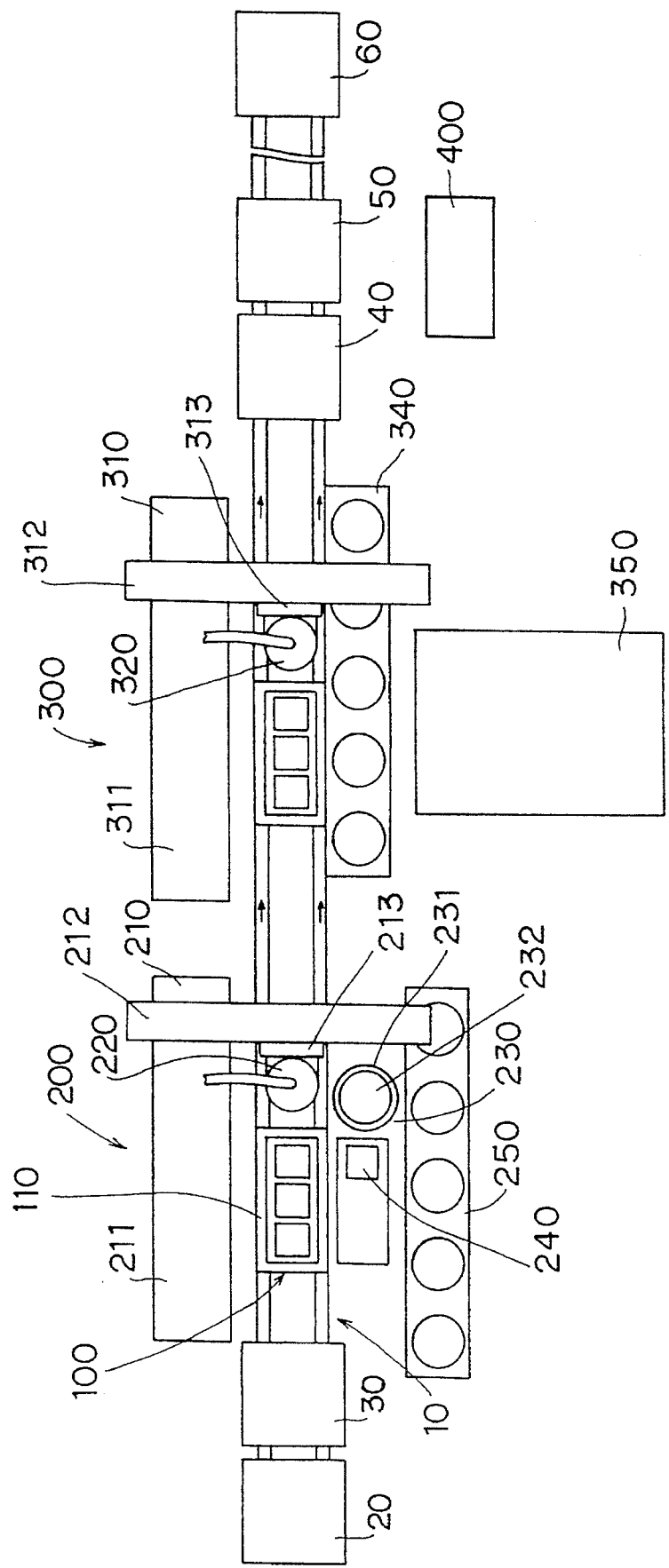
FIG. 1 is a plane view of the first embodiment of the solder ball supply device according to the present invention.

Embodiments of the present invention will be described in detail by referring to the drawings.

FIG. 1 is a plane view of the first embodiment of the solder ball supply device according to the present invention.

This solder ball supply device consists of a substrate transfer means 100 which can move along conveyer 10, a flux supply means 200 positioned near the upstream side of conveyer 10, solder ball supply means 300 positioned near conveyer 10 on the downstream side than the flux supply means 200, and a control means 400 which controls relative movements of these means 100, 200 and 300.

The conveyer 10 in this embodiment functions also as the conveyer for reflow-type soldering device, so that provided on the upstream side of the flux supply means 100 are a substrate delivery means 20 and electrical check means 30, and on the downstream side of the solder ball supply means 300, an image processing means 40, a reflow furnace 50, and a substrate discharge means 60.

Namely, the flux supply means 200 and the solder ball supply means 300 are incorporated in the reflow soldering device. This construction ensures the use of the control means for controlling actions of the reflow soldering device as the control means 400.

Substrate transfer means

Figure 2:
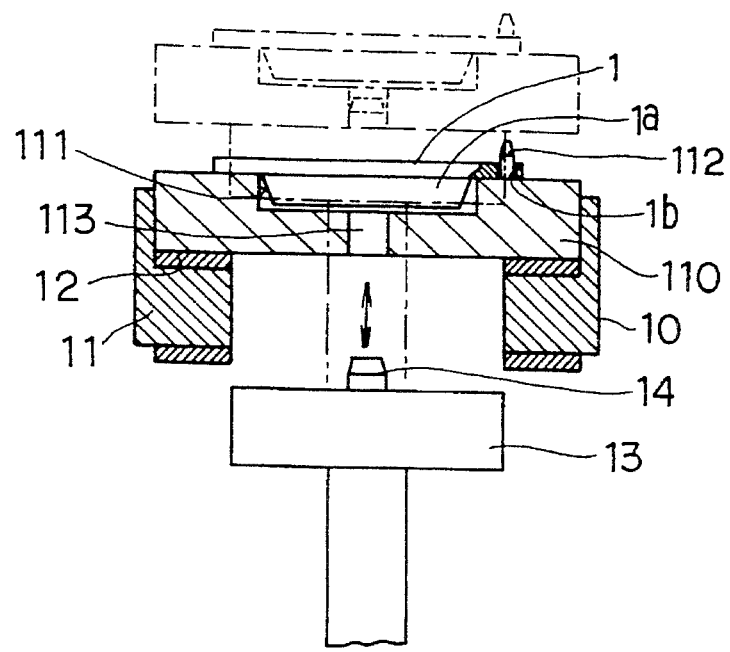
FIG. 2 is a longitudinal section across the shorter-length direction of a conveyer and a substrate transfer means.
Figure 3:
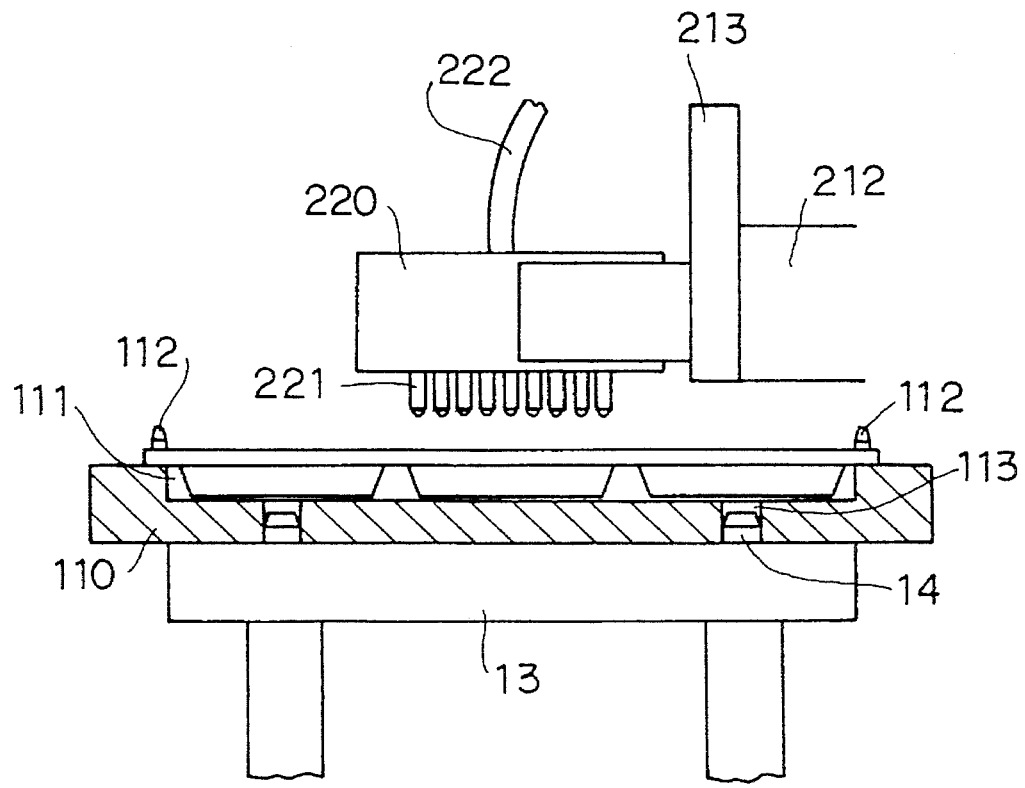
FIG. 3 is a longitudinal section along the longer-length direction of the substrate transfer means.

FIG. 2 is a longitudinal section across the shorter-length direction of conveyer 10 and substrate transfer means 100 and FIG. 3 is a longitudinal section along the longer-length direction of substrate transfer means 100.

As shown in these figures, the substrate transfer means 100 is mounted on a belt 12 which moves along rail 11 for conveyer 10 and equipped with a carrier 110 which moves together with the belt 12.

Recess 111 are formed on the surface of the carrier 110. Substrate 1 carrying (sealed) IC chips thereon is installed on carrier 110, with the (sealed) IC chip side 1a being held in the recess 111 and the input and output terminals facing the surface. In this instance, the substrate 1 is fixed to the specified position in carrier 110 by engaging positioning pins 112 to projecting from carrier 110 to holes 1b provided in the substrate 1.

The recesses 111 in carrier 110 are so deep that a variety of IC chips sealer 1a with different thicknesses are held therein, so as to enable the periphery of substrate 1 to be always located around the periphery of the carrier 110. The position of the substrate 1 installed on carrier 10 thus keeps always a specified height, equivalent to carrier 110, irrespective to the thickness of IC chips sealer 1a. In this manner, by always keeping substrate 1 installed on carrier 110 at a specified height supply of flux by flux supply means 200 and supply of solder balls by solder ball supply means 300 can be always carried out at a certain specified level irrespective of the types of substrate 1 (IC chips sealer 1a). This makes it easy to work out programs for actuating the flux supply means 200 and the solder ball supply means 300.

When flux supply means 200 and solder ball supply means 300 are moved to the position where the supply operations are carried out, the carrier 110 is raised to a prescribed level by a locator 13 which is installed below conveyer 10 movably up and down to position the carrier 110 in the longitudinal direction, as shown in chain lines in FIG. 2. In this instance, the positioning pins 14 projecting from upper side of locator 13 engages holes 113 in the lower side of carrier 110 to ensure positioning in the horizontal direction at the same time.

Carrier 110 may be replaced by another one with recesses having different size and depth depending on the types of the subjects to which solder balls are supplied.

Flux supply means

As shown in FIG. 1, flux supply means 200 consists of robot 210, flux dispenser 220, dispenser cleaner 230, dispenser checker 240, and dispenser holder 250.

Robot 210 consists of base table 211 located in the neighborhood of conveyer 10, arm 212 which is mounted on the base table 211 movably to the same direction to which the carrier 110 moves (X axis direction), and movable table 213 installed on the arm 212 movably to the right angle (Y axis direction) of the direction to which the carrier 110 moves.

Figure 4:
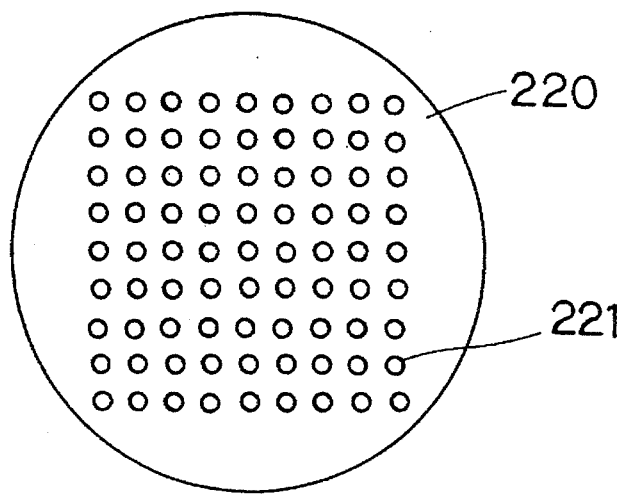
FIG. 4 is a rear plan view of a flux dispenser.

The flux dispenser 220 is provided on the movable table 213, movably to the up and down direction (Z axis direction). As shown in FIG. 3, the flux dispenser 220 is provided with a number of nozzles 221 on the underside thereof, so as to inject a suitable quantity of flux which is sent via feed pipe 222 from a flux tank which is not shown in the figure. Nozzles 221 are designed to take the same pattern as that of input and output terminals on the substrate 1 which is transferred by carrier 110. FIG. 4 is a rear plan view of a flux dispenser, and shows an example in which nozzles 221 are provided matrixwise.

A robot having the same type of construction as that in conventionally used one can be used as said robot 210.

Dispenser cleaner 230 is located near the place where carrier 110 for the supply of flux is positioned. This dispenser cleaner 230 is to remove flux residue adhered to nozzle 221 of dispenser 220 and comprises a table 231 and a material 232 like cloth which is capable of absorbing the flux and arranged on table 231, so that the flux residue adhered to the tip of nozzle 221 can be removed by pressing the nozzle of the dispenser 220 to cleaner 230 prior to supply of flux.

Dispenser checker 240 is to check if the flux is surely injected from nozzles 221 and is positioned adjacent to dispenser cleaner 230. This dispenser checker 240 is formed by a plate-like material resistant to the flux, such as transparent or semi-transparent glass or hard plastic. The check to ascertain whether the flux is injected in normal way from nozzles 221 is performed by injecting a small amount of flux from nozzles 221 of dispenser 220 to this plate-like material and observing the manner in which the flux is adhered.

This check may be carried out each time the flux is supplied. It is, however, possible to do this check after several times of flux supply, i.e., it is sufficient to perform one check for several supplies of flux. Judgment as to whether the flux is injected from nozzles 221 to the plate-like material in a normal way can be performed either by naked eye observation of the manner in which the flux is adhered by the operator or by automatic judgment using, for example, an image processing means or the like.

Dispenser holder 250 is located outside the dispenser cleaner 230 and dispenser checker 240 and is designed so as to hold a plurality of flux dispensers 220.

The purpose of providing the holder 250 for flux dispenser 220 is to store flux dispensers 220 adaptable to various types of input and output terminal patterns in substrate 1, stand-by flux dispensers 220 of the same pattern, and the like. This dispenser holder 250 has almost the same construction as the container 340 of solder ball head 320, shown in FIG. 6, and in which flux dispensers are held in the manner in which nozzles 221 do not interfere with holders (not shown in the drawings).

Solder ball supply means

As shown in FIG. 1, the solder ball supply means 300 consists of robot 310, solder ball head 320, container 340 of the solder ball head 320, and solder ball discharger 350.

Robot 310 consists of base table 311 located in the neighborhood of conveyer 10 in the downstream side than robot 210 of flux supply means 200, arm 312 which is mounted on the base table 311 movably to the same direction to which the carrier 110 moves (X axis direction), and movable table 313 installed on the arm 312 movably to the right angle (Y axis direction) of the direction to which the carrier 110 moves.

Figure 5:
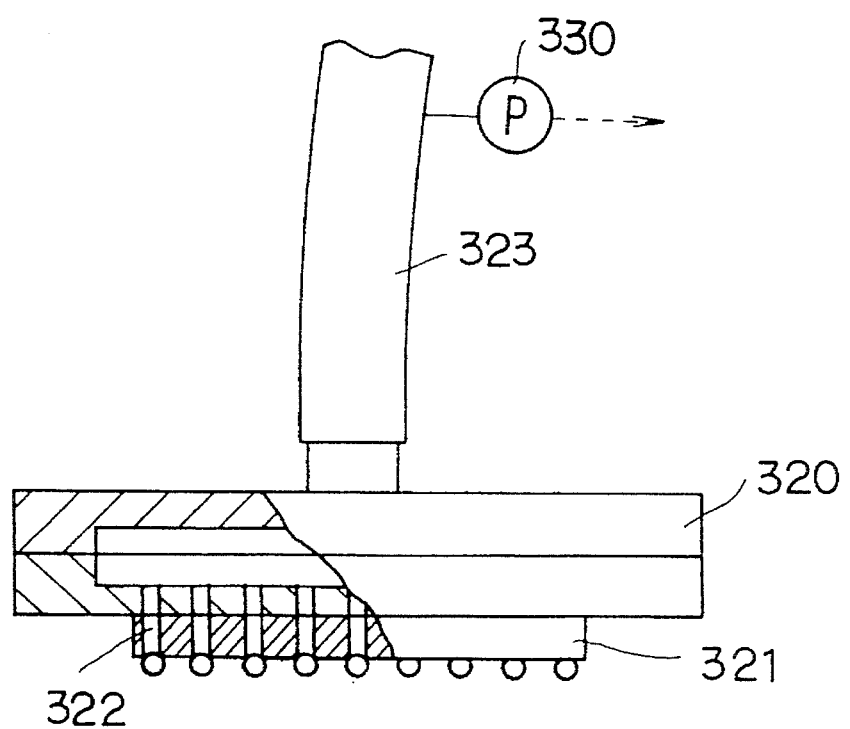
FIG. 5 is a partially broken expanded view of a solder ball head.

The solder ball head 320 is provided on the movable table 313, movably to the up and down direction (Z axis direction). As shown in FIG. 5, the solder ball head 320 is provided with a number of air suction holes 322 in the air suction head 321 on the underside thereof. The air suction holes 322 is connected to vacuum pumps (not shown in the figure), switch valves (not shown in the figure), pressure sensor 330, and the like, via connection pipe 323.

The air suction hole 322 thus adsorbs or discharges solder balls by air suction or air discharge, which is actuated by the vacuum pump and switch valve.

When the internal pressure of air suction hole 322 is equivalent to atmospheric pressure, solder balls can be released and discharged from the air suction hole 322 by their self-weight. If the internal pressure of air suction hole 322 is raised slightly higher than atmospheric pressure, solder balls can be discharged from the air suction hole 322 more rapidly and surely.

In the event that solder balls cannot be adsorbed in any one of air suction holes 322 for some reason when the supply of solder balls is necessary, the air pressure in connection pipe 323 connected to solder ball head 320 is raised above the standard value. This pressure change can be detected by the pressure sensor 330, and the fault in the adsorption of solder balls can be judged by the control means 400.

The container 340 of solder ball head 320 is located vis-a-vis the table 311 of robot 310 across conveyer 10, and contains a plurality of solder ball heads.

The purpose of providing the container 340 for solder ball heads 320 is to store solder ball heads 320 adaptable to various types of input and output terminal patterns in substrate 1, stand-by solder ball heads 320 of the same pattern, and the like.

Figure 6:
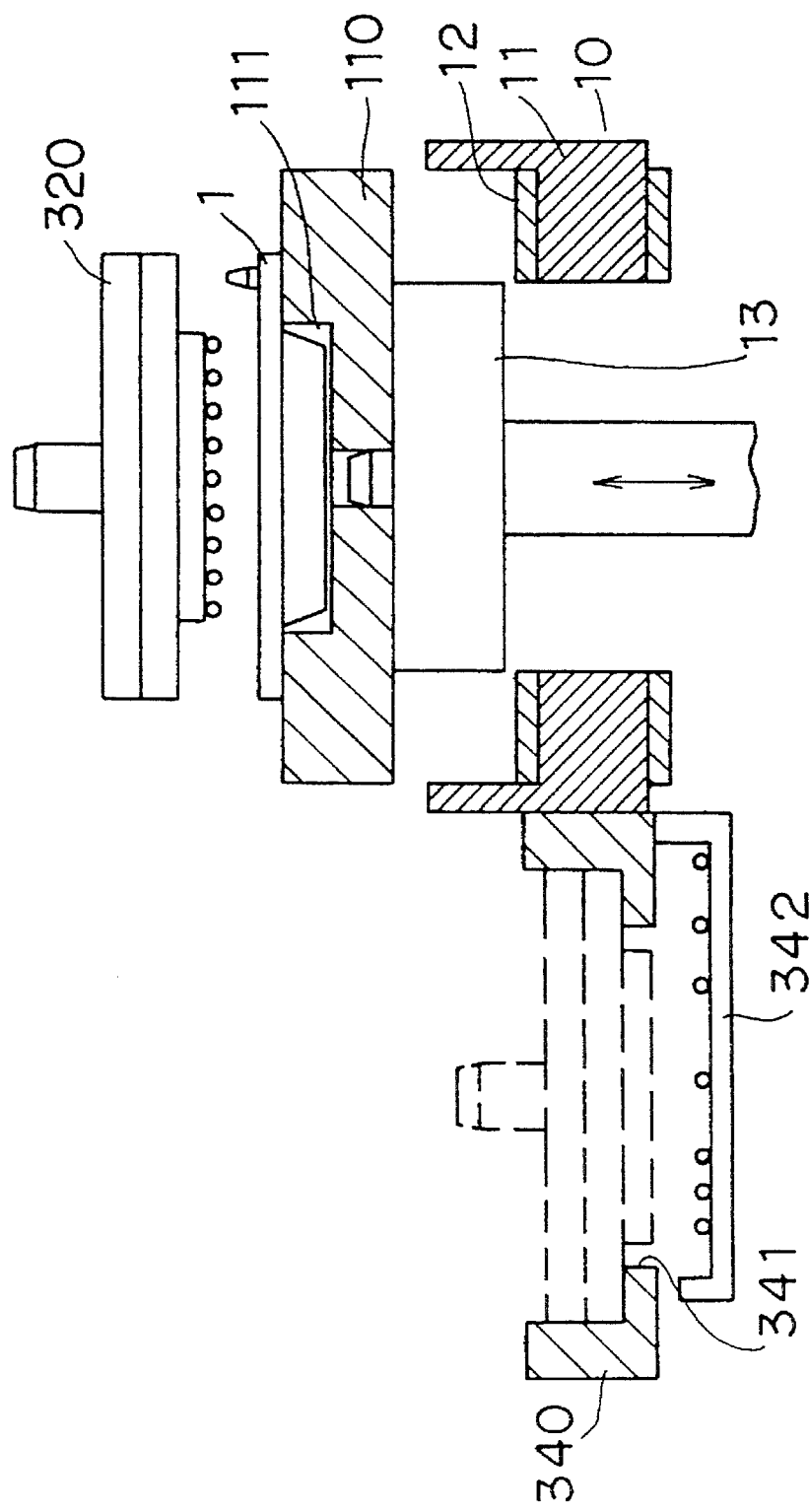
FIG. 6 is a cross-sectional view of a solder ball head container section and a failed ball reclaiming tray.

As shown in FIG. 6, container 340 is provided with head container hole 341, and the solder ball heads 320 are held in the manner in which solder ball head 321 does not interfere with the container hole 341.

A failed ball reclaiming tray 342 is provided under container 340. When solder ball head 320 fails to adsorb solder balls, the solder ball head 320 is moved to head container hole 341, where all solder balls adsorbed in air suction hole 322 are discharged to the solder ball reclaiming tray 342. Arranging the reclaiming tray 342 under the container 340 as mentioned above makes it possible to use one space for two or more parts and thus to make the device small. Of course, the place where the reclaiming tray 342 is positioned is not limited to the underneath of the container.

Figure 7:
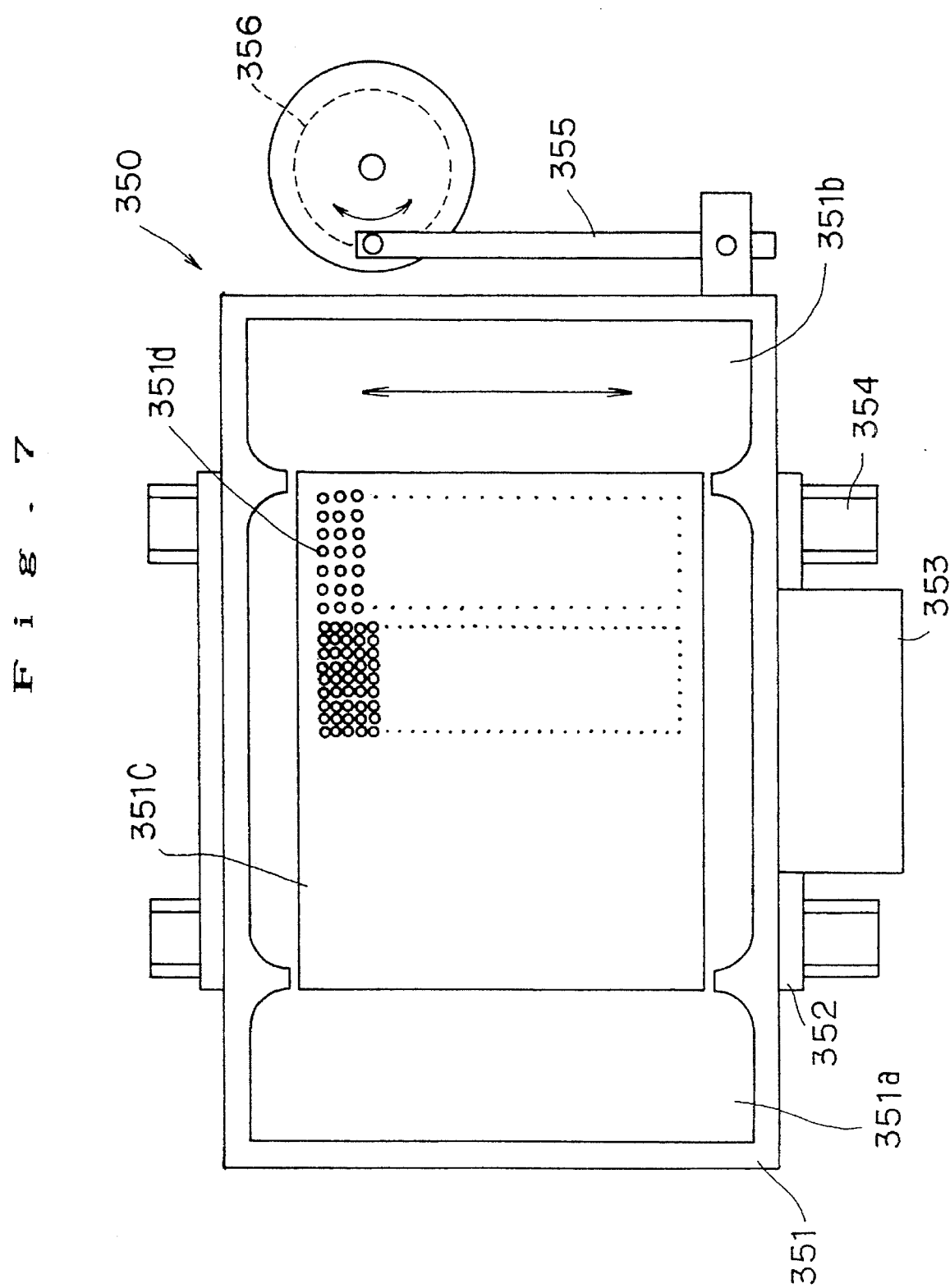
FIG. 7 is a plan view of a solder ball discharger.
Figure 8:
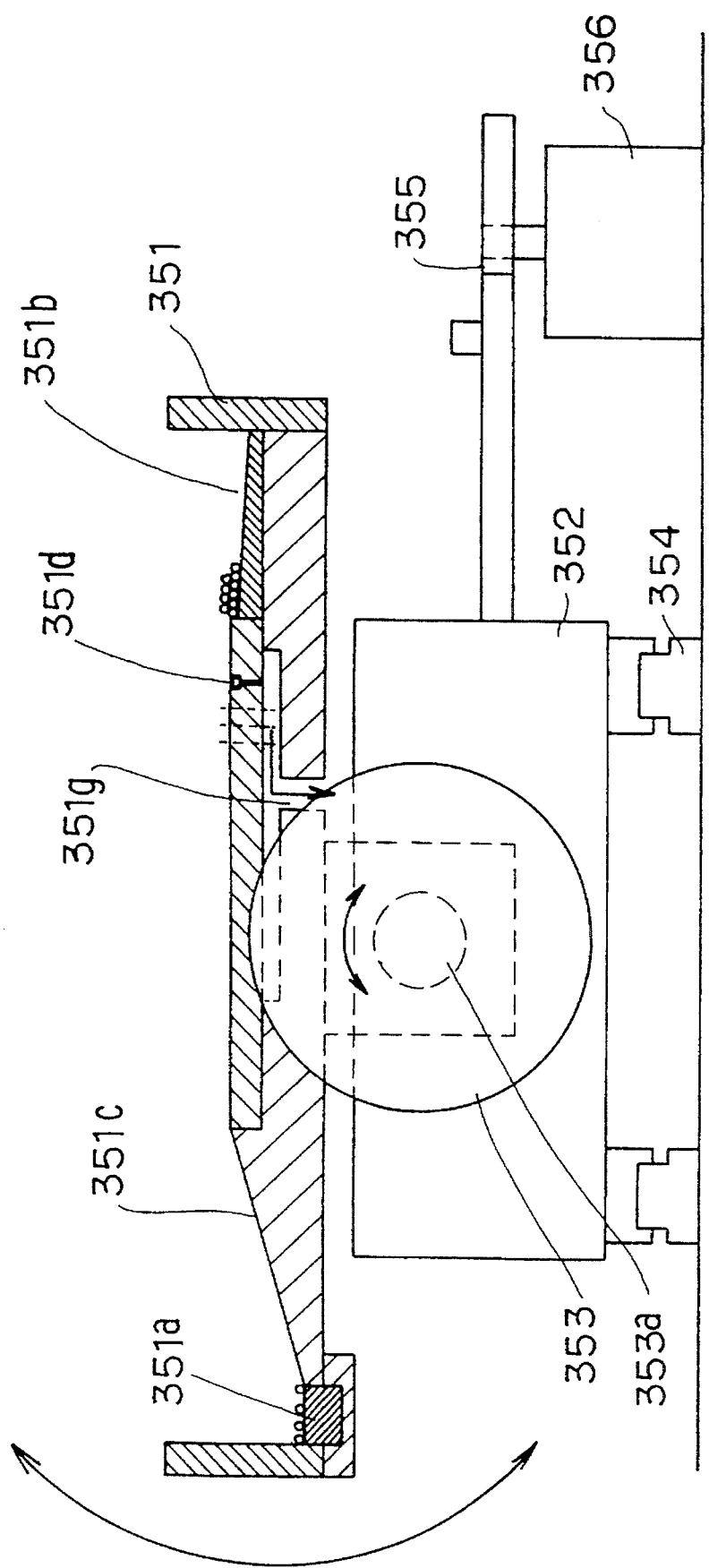
FIG. 8 is a partially broken cross-sectional view from the side of the solder ball discharger.
Figure 9:
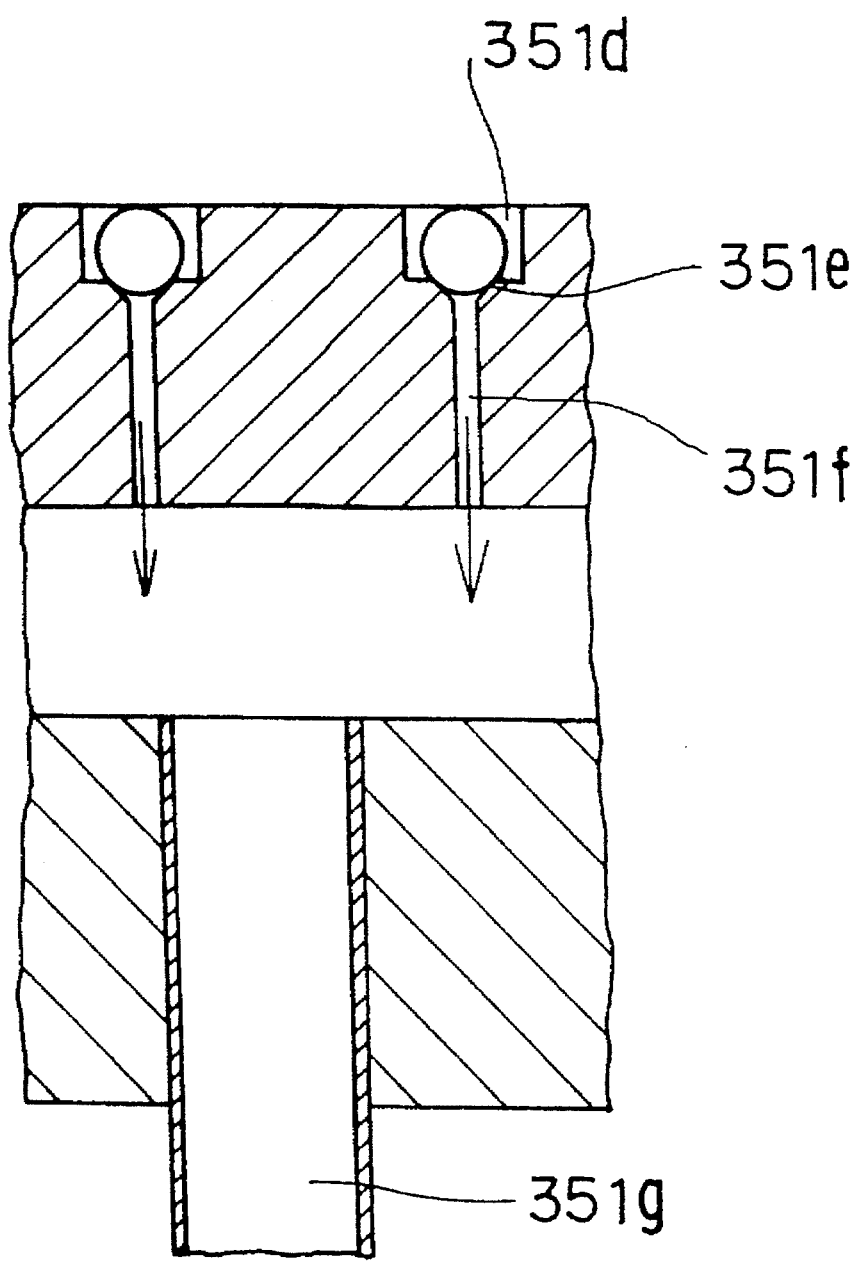
FIG. 9 is an enlarged cross-sectional view of solder ball holding cavities in the solder ball discharger.

FIG. 7 is a plan view of solder ball discharger, FIG. 8 is a partially broken cross-sectional view from the side thereof, and FIG. 9 is an enlarged cross-sectional view of solder ball holding cavities in the solder ball discharger.

The solder ball discharger 350 consists of a discharge plate 351, a table 352 supporting the discharge plate 351 in the manner in which it can freely swing, a motor 353 which forms a swinging means, a swing axis 353a, rails 354 which is a means for reciprocally driving the table 352 to the right angle (Y axis direction) of the direction to which the discharge plate 351 swings (X axis direction), crank mechanism 355, and the like.

The discharge plate 351 is formed plane and rectangular to the direction to which the discharge plate 351 swings, and provided along one side to the longitudinal direction of the rectangle with a deep groove acting as a solder ball reservoir 351a and on another side a shallow groove which functions as a solder ball return means 351b. Further provided between the solder ball reservoir 351a and the solder ball return section 351b, and adjacent to the solder ball return section 351b, are a number of solder ball holding cavities 351d matrixwise to the direction of Y axis. Further, provided is solder ball rolling section 351c which forms a slope between groups of matrixes of solder ball holding cavities and the solder ball reservoir 351a.

Placing a number of solder ball holding cavities 351d matrixwise enables the device to be adapted to any solder ball supply means 300 with any patterns, i.e., to substrate 1 with any input and output terminal patterns, inasmuch as the holes are provided with the same pitch.

Further, if plurality groups of matrixes of solder ball holding cavities with different hole pitches are provided (in the Figure two types of these are shown), these can be readily adapted to changes in the pitch of input and output terminals in substrate 1.

These groups of solder ball holding cavities can be arranged in other shapes than matrixes. Two or more types of patterns corresponding to the patterns of input and output terminals in substrate 1 may be provided.

A tapered recess 351e is formed in the bottom of each solder ball holding cavity 351d. Further, joined with the recess 351e is an air suction hole 351f, which is connected to air suction-discharge pump, switch valve, and the like (not shown in Figures) via air tube 351g formed in the discharge plate 351.

Providing tapered recess 351e at the bottom of each cavity 351d ensures to store solder balls with different diameters in a stable manner. In addition, air suction created by air suction hole 351f joined with the recess 351e enables solder balls to be firmly stored within the solder ball holding cavities 351d. Furthermore, the solder balls can be discharged without fail from the cavity 351d by discharging air from air suction hole 351f, when the solder balls are adsorbed by solder ball head 320.

The section where solder ball holding cavities 351d are provided matrixwise is constructed a little bit higher than the solder ball return section 351b, so that there is a small step at the boundary of these two sections. Solder balls to be returned collide against this step so that they can easily be diffused to the direction (Y axis direction) perpendicular to the longitudinal direction of discharge plate 351.

Base table 352 is provided with a swinging axis 353a which can swing by motor 353. Discharge plate 351 at near the center thereof is fixed by the swinging axis 353a. Accordingly, when the swinging axis 353a swings, the discharge plate 351 moves like a seesaw to the longitudinal direction (X axis direction). In this instance, swinging axis 353a can swing large at the beginning and thereafter a little several times by controlling rotation of motor 353.

Further, base table 352 is mounted movably on rail 354, which is provided to the direction of Y axis, and connected to the link of the crank mechanism 355. The base table 352 therefore moves reciprocally to the Y axis direction and swings the discharge plate 351.

The solder ball supply device of the first embodiments in the present invention having a construction as described above is operated by instruction from control means 400 as follows.

Substrate 1 is supplied from substrate delivery means 20 in FIG. 1 to carrier 110 on conveyer 10 and set on the carrier 110. In this instance, as shown in FIG. 2, IC chip sealed section 1a of substrate 1 is held in the recess 111, and the substrate 1 is fixed at a specified position by the engagement of the hole 1b on substrate 1 and a positioning pin 112.

Next, the electric characteristics are tested by electric check means 30. In the event that any abnormality is found by the electric check means 30, substrate 1 together with carrier 110 is removed by an operator or any ejector means which is not shown in the drawings.

On the other hand, when electric check means 30 finds no abnormality, substrate 1 along with carrier 110 is moved to the front of flux supply means 200 on belt 12 of conveyer 10. When the carrier 110 stops at a specified position in front of flux supply means 200, locater 13 is raised by a driving means, not shown in the drawings, whereby a positioning pin 14 on the upper part of the locater 13 engages the hole 113 of the carrier. At the same time carrier 10 is raised to a certain distance (see FIG. 2). Carrier 1, or substrate 1, is thus positioned both horizontally and vertically.

After positioning of substrate in this manner, flux dispenser 220 comes down toward the input and output terminals of substrate 1 for supplying flux thereto. As the flux dispenser 220, a dispenser with nozzles 221 arranged in a pattern corresponding to the pattern of the input and output terminals of substrate 1 is taken out from holder 250 of robot 210 and fixed on movable table 213 in advance. Mounting of flux dispenser 220 on robot 210 may be performed manually.

The flux dispenser 220 is moved to dispenser cleaner 230 by robot 210, where nozzles 221 are cleaned and, if necessary, supply of flux from nozzles 221 is confirmed by dispenser checker 240. After this, flux dispenser 220 is further moved to the input and output terminals of substrate 1, where a suitable amount of flux is injected.

After the supply of flux in this manner, locator 13 comes down to locate carrier 110 again on belt 12 and transfer it to the front of solder ball supply means 300. Here, locater 13 again comes up by the driving means which is not shown in the drawings to engage positioning pin 14 on the upper part of the locater 13 to the hole 113 of carrier 10 and, at the same time, to move carrier 10 upward for a certain distance (see FIG. 6). Carrier 110, or substrate 1, is thus positioned both horizontally and vertically.

Solder ball head 320 with air suction holes 322 arranged in a pattern corresponding to the pattern of the input and output terminals of substrate 1 is taken out from container 340 and fixed on robot 310 of solder ball supply means 300 in advance. The robot 310 then moves to solder ball discharger 350 to adsorb solder balls.

On the other hand, the discharger 350 is swung by motor 353 at swing axis 353*a*, and base table 352 is moved by motor 356 reciprocally to the Y axis direction via crank mechanism 355. This allows discharge plate 351 to perform seesaw movement to the X axis direction and simultaneously to swing in the Y axis direction. In this instance, the seesaw movement is initially large, but should be small two or three times thereafter. The swing to the Y axis direction should be large enough for solder balls in solder ball reservoir 351*a* and solder ball return section 351*b* to be evenly dispersed to the Y axis direction.

As a result, solder balls roll on charge plate 351 to the X axis direction in an even amount to the Y axis direction, and reciprocate several times between solder ball reservoir 351*a* and solder ball return section 351*b*, while some falling into solder ball holding cavities 351*d*. Because solder ball holding cavities 351*d* suction air through air suction hole 351*f* provided at their bottom, solder balls falling into the solder ball holding cavities 351*d* are held by recess 351*e* without fail.

When solder ball head 320 comes down to the solder ball holding cavities 351*d*, air suction holes 322 in the solder ball head 320 suction air, while controlling air intake through air suction hole 351*f* of the solder ball holding cavities 351*d* to be terminated. This allows solder balls which are held in solder ball holding cavities 351*d* to be adsorbed in air suction hole 322 of the solder ball head 320.

Then, pressure sensor 330 provided in an air suction route of solder ball head 320 measures the pressure at connection pipe 322 of the solder ball head 320 which has adsorbed solder balls. When the measured pressure is equivalent to a standard pressure value, control section 400 will judge the conditions to be normal, where solder balls are adsorbed in all air suction holes 322 in solder ball head 320. When the pressure is higher than the standard pressure value, it will judge the conditions to be abnormal, where solder balls are not adsorbed in part of air suction holes 322.

When the conditions are judged to be normal, the solder ball head 320 is moved by robot 310 above the input and output terminal of substrate 1 in which flux has been supplied. The solder ball head 320 then slightly presses solder balls to the input and output terminals and terminates air intake by air suction holes 322. This action permits solder balls to be supplied on input and output terminals of substrate 1.

On the other hand, when the conditions are judged to be abnormal, the solder ball head 320 is moved by robot 310 above head container hole 341 of container 340 where there is no solder ball head 320. Solder balls are then discharged to failed ball reclaiming tray 342 from the head container hole 341 by termination of air intake through air suction holes 322 of the solder ball head 320. The solder ball head 320 from which solder balls have been discharged is again moved to solder ball discharger 350 by robot 310, where solder balls are absorbed.

Two or more flux dispensers 220 and solder ball heads 320, which are adaptable to different patterns of input and output terminals of substrate 1 and pitches between the input and output terminals, are provided for selection among these of an appropriate flux dispenser 220 and an appropriate solder ball head 320 corresponding to a pattern and pitch of input and output terminals.

Because solder ball holding cavities 351*d* in the discharger 350 are arranged with the same pitch and the same matrix as those of input and output terminals of substrate 1 to which solder balls are supplied, these are adaptable to various input and output terminal patterns having the same terminal pitch or a pitch larger than those on the substrate by a magnification of an integer.

Further, when there are two or more different pitches in input and output terminals of substrate 1 to which solder balls are to be supplied, the discharger 350 may be provided with different types of solder ball holding cavities 351*d* matrixwise corresponding to these different pitches. The discharger shown in the drawings as an example is provided with two groups of solder ball holding cavities, each group having a different pitch from the other and arranged matrixwise.

Further, it is possible to provide a plural number of dischargers 350 with groups of the same type of solder ball holding cavities and/or a plural number of dischargers 350 with groups of different types of solder ball holding cavities.

Provision of a plural number of dischargers 350 allows for one of the dischargers to charge solder balls in solder ball holding cavities 351*d*, while the solder ball head 320 is receiving solder balls from the other discharger 350. In addition, it is possible to charge supplemental solder balls when the amount of solder balls in the discharger 350 is small. This makes it possible to perform the operation for taking out solder balls from solder ball discharger 350 without any waiting time.

Furthermore, it is possible that robot 210 of flux supply means 200 is provided with a plural number of flux dispensers 220 with nozzles 221 having different pitches and/or patterns, thereby eliminating the need for replacing a flux dispenser 220 with other one (in this instance, the need for providing flux holder 250 is also eliminated). Even if such replacement is not entirely eliminated, at least frequent replacement can be avoided.

This also applies to solder ball supply means 300. That is to say, the robot 310 may be provided with two or more solder ball heads 320 with air suction holes 322 having different pitches and/or patterns.

Figure 10:
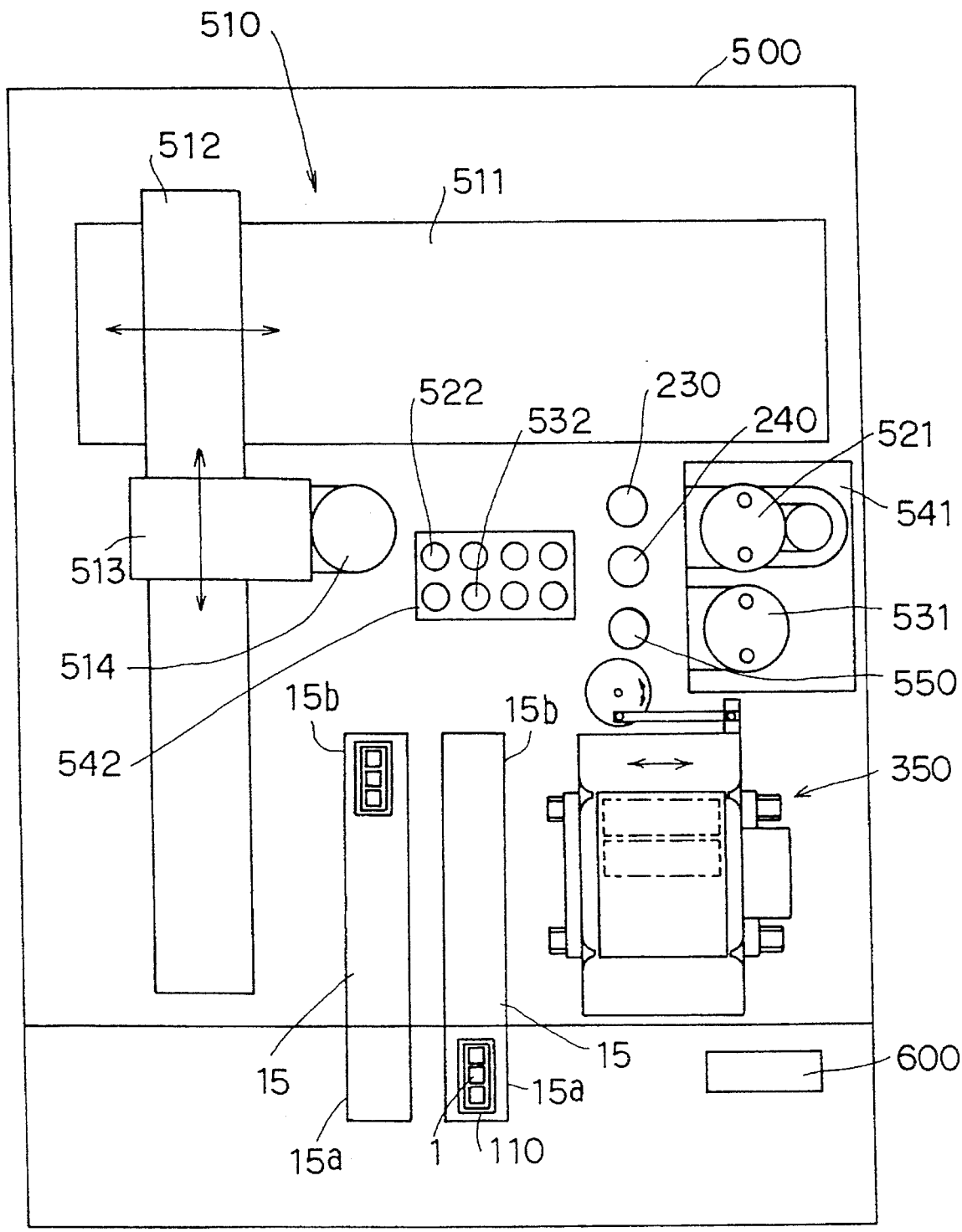
FIG. 10 is a plane view of the second embodiment of the solder ball supply device according to the present invention.

FIG. 10 is a plane view of the second embodiment of the solder ball supply device according to the present invention.

This solder ball supply device is of a semi-automatic type. The device is constructed such that all operations, such as delivery of substrates to which solder balls are to be supplied, exchange of flux nozzles to be mounted on the flux dispenser, exchange of air suction holes' heads to be mounted on the solder ball head, and the like, can be operated by operators or by instructions from the operators.

This solder ball supply device employs one robot for a flux supply means and a solder ball supply means, which together form a flux and solder ball supply means. All means in this device are housed in a cover.

Transfer slider 15 for substrate 1 is provided with a substrate delivery section 15a, which is located outside the cover 500 of the device, and a solder ball supply section 15b inside the cover 500. This transfer slider may comprise conveyer 10 in the same manner as in the first embodiment, or may employ, instead of the conveyer, ball screws and nuts or, cylinders, which are conventionally used as a transfer slider. The transfer slider 15 is provided with the same type of carrier 110 as in the first embodiment, which reciprocates between substrate delivery section 15a and solder ball supply means 15b. A pair of transfer sliders 15 are provided in parallel.

Positioning of substrate delivery section 15a and solder ball supply section 15b can be carried out in the same manner as in the above-described first embodiment or by using any other conventional positioning means. When substrate delivery to carrier 110 is performed by a manual operation by a operator, no accurate positioning is required for locating substrate delivery section 15a on carrier 110.

Robot 510 which supplies flux and solder balls consists of base table 511, arm 512 mounted thereon movably to the longitudinal direction of the base 511 (X axis direction), movable table 513 installed on the arm 512 movably to the right angle (Y axis direction) of the direction to which the arm 512 moves, and robot head 514 provided on the movable table 513 movable up and down.

Figure 11B:
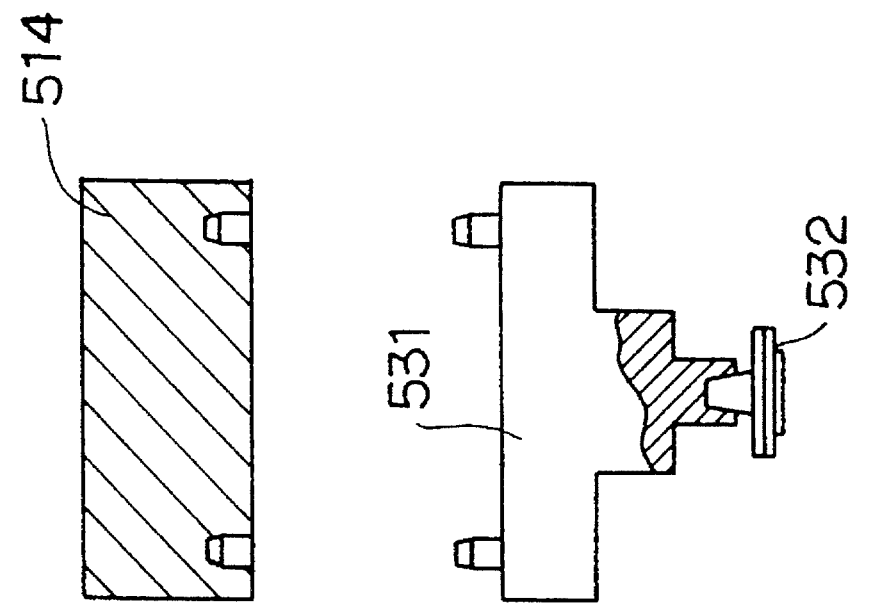
FIG. 11(b) shows relationship among the robot head, solder ball head and air suction holes' head.
Figure 11A:
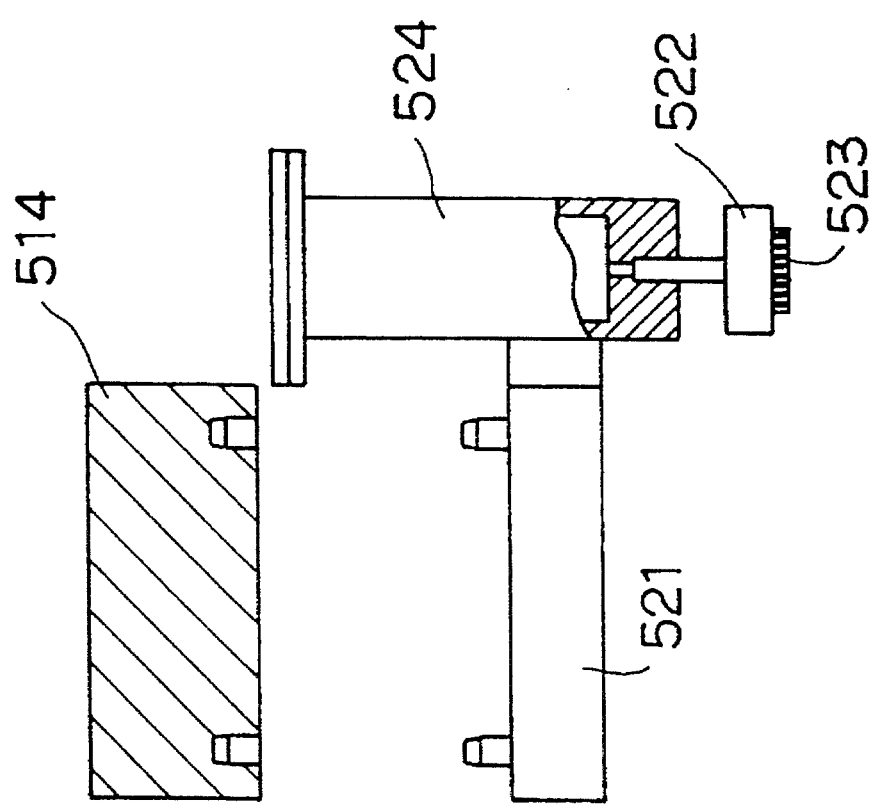
FIG. 11(a) shows relationship among the robot head, flux head and flux dispenser.

As shown in FIGS. 11(a) and 11(b), the robot head 514 is provided with a means for interchangeably mounting flux head 521 and solder ball head 531. The flux head 521 is provided with a means for interchangeably mounting flux dispenser 522, and the solder ball head 531 is provided with a means for interchangeably mounting air suction holes' head 532. Any known mounting means can be used as the means for mounting flux head 521 and solder ball head 531 on the robot head 514; for mounting flux dispenser 522 and air suction holes' head 532 on the flux head 521 and the solder ball head 531, respectively.

Flux head 521 and solder ball head 531 are placed on table 541. Regarding flux dispenser 522 and air suction holes' head 532, those having nozzles 523 arranged corresponding to the patterns of input and output terminals in substrate 1 and those having air suction holes (not shown in the drawings) are provided, several types for each, and these are placed in a row in container 542. In this second embodiment, flux head 521 is provided with a flux tank 524.

Dispenser cleaner 230, dispenser checker 240, and solder ball discharger 350 are all constructed in the same manner as those in the first embodiment. In this second embodiment, failed ball reclaiming tray 550 are separately provided from container 542. Of course, it is possible to provide the failed ball reclaiming tray 550 below the container hole of solder ball head 531 of the container 542.

The above-mentioned solder ball supply section 15b of transfer slider 15, table 541 for placing flux head 521 and solder ball head 531, container for holding flux dispenser 522 and air suction holes' head 532, dispenser cleaner 230, dispenser checker 240, failed ball reclaiming tray 550, and solder ball discharger 350 are all installed within the working area of robot 510.

The solder ball supply device of the second embodiment thus constructed is operated as follows.

Substrate 1 is set on carrier 110 positioned at substrate delivery section 15a of transfer slider 15 by an operator. After setting the substrate 1, an operation panel 600 is manipulated so as to actuate the transfer slider 15 to move carrier 110 to solder ball supply section 15b. Then, a container for holding flux dispenser 522 and an air suction holes' head 532 having the same pattern as the input and output terminal pattern of substrate 1 is designated from operating panel 600.

Then, the operating panel 600 is instructed to actuate the device, and based on this instruction robot 510 of flux-solder ball supply means moves to take out flux head 521 from table 541 for fixing on robot head 514. Next, a flux dispenser 522 having nozzles arranged in the designated pattern is taken out of container 542 and fixed on flux head 521. The operation for fixing the flux dispenser 522 on the flux head 521 may be performed manually.

Thereafter, the flux dispenser 522 is moved to flux dispenser cleaner 230 by the flux supply action of robot 510 to remove flux residue attached to nozzles 523. Then, after confirmation of flux injection from nozzles 523 using flux dispenser checker 240, as needed, the flux dispenser dispenser 522 is moved to substrate 1. A suitable amount of flux is injected onto the input and output terminals from flux dispenser 522.

Upon completion of supply of the flux, flux dispenser 522 is taken out from robot head 514 and put away to table 541. Then, solder ball head 531 is taken out from table 541 to be mantled on robot head 514. Further, an air suction holes' head 532 having air suction holes arranged in the designated pattern is taken out of container 542 and mantled on solder ball head 531.

Thereafter, in accordance with the solder ball supply action of robot 510, the solder ball head 531 moves to discharger 350, where solder balls are adsorbed by air suction holes' head 532, and further moves to substrate 1 to supply solder balls onto input and output terminals.

Robot 510 returns to its waiting position after supply of flux and solder balls in this manner. Upon confirmation of supply of solder balls to the substrate, the operator manipulate operation panel 600 so as to return carrier 110 to substrate delivery section 15a of transfer slide 15 to take out substrate 1.

In this instance, a new substrate 1 is set on carrier 110 of another transfer slide 15, while flux and solder balls are being supplied to said substrate, so that this old substrate may be returned to delivery section 15a upon completion of supply of solder balls thereto, and at the same time, said new substrate 1 may be moved to solder ball supply section 15b to receive supply of flux and solder balls.

INDUSTRIAL APPLICABILITY

As illustrated above, the solder ball supply device of the present invention is useful for promoting productivity in industrial fields where a great number of solder balls are to be supplied at one time, such as supply of solder for fixing tip parts of surface-mount-type to substrates and supply of solder to flip tips.

We claim:

1. A solder ball supply device comprising:
   a discharger in which solder ball holding cavities are provided matrixwise, and
   a solder ball supply means which is provided with a head section with a number of air suction holes provided at the same pitch as the solder ball holding cavities in said discharger, and which takes out a large number of solder balls at one time from solder ball holding cavities at the head section to transfer and supply them to the specified place.

2. The solder ball supply device as claimed in claim 1, further provided with a flux supply means which is equipped with a flux dispenser in which nozzles are arranged in the same pattern as the air suction holes in the head section of said solder ball supply means, and which supplies flux at one time to the specified place prior to the supply of the solder balls.

3. The solder ball supply device as claimed in claim 1, wherein said specified place to which said flux or said solder balls are supplied is input and output terminals of IC chips on the printed substrate which is set on a transfer means.

4. The solder ball supply device as claimed in claim 3, wherein said transfer means has deep recesses where IC chips carried on the substrate are held such that input and output terminals of the substrate can be positioned at a specified height irrespective of the thickness of the IC chips.

5. The solder ball supply device as claimed in claim 1, wherein said discharger is provided with groups of solder ball holding cavities arranged matrixwise, each group having different pitches from others.

6. The solder ball supply device as claimed in claim 1, wherein said solder ball holding cavities are linked to an air suction-discharge means which suctions air when solder balls are loaded and discharges air when solder balls are taken out.

7. The solder ball supply device as claimed in claim 1, wherein said discharger swings, initially large and thereafter small a plural number of times, to the direction to which solder balls roll.

8. The solder ball supply device as claimed in claim 7, wherein said discharger reciprocates perpendicularly to the direction to which solder balls roll, along with its swinging movements.

9. The solder ball supply device as claimed in claim 1, wherein said solder ball supply means has different types of solder ball heads to be interchangeably mounted and is provided with a container section wherein different types of solder balls are held.

10. The solder ball supply device as claimed in claim 9, wherein a failed ball reclaiming tray is provided integrally with said container section.

11. The solder ball supply device as claimed in claim 2, wherein said flux supply means is provided with a flux cleaner for removing flux residue adhered to nozzles of flux dispensers.

12. The solder ball supply device as claimed in claim 1, wherein said flux supply means is provided with a flux checker for checking the conditions of flux injection from nozzles of flux dispensers.

13. The solder ball supply device as claimed in claim 1, wherein said solder ball supply means has a plural number of solder ball heads to be selectively used, said solder ball heads being arranged with patterns and/or pitches different from those of air suction holes.

14. The solder ball supply device as claimed in claim 2, wherein said flux supply means has a plural number of flux dispensers to be selectively used, each of said flux dispensers having nozzles arranged in different patterns and/or having different pitches from others.

15. The solder ball supply device as claimed in claim 2, provided with one robot for flux supply means and solder ball supply means, wherein the flux head or the solder ball head are selectively and interchangeably mounted on the head of said one robot.

16. The solder ball supply device as claimed in claim 13, wherein a flux dispenser is interchangeably mounted on said flux head and an air suction holes' head is interchangeably mounted on said solder ball head.

* * * * *